United States Patent
Kao et al.

(10) Patent No.: US 11,151,724 B2
(45) Date of Patent: Oct. 19, 2021

(54) AUTOMATIC DETECTING METHOD AND AUTOMATIC DETECTING APPARATUS USING THE SAME

(71) Applicant: UNITED MICROELECTRONICS CORP., Hsinchu (TW)

(72) Inventors: Tzu-Ping Kao, Kaohsiung (TW); Ching-Hsing Hsieh, Hsinchu County (TW); Chia-Chi Chang, Tainan (TW); Ju-Te Chen, Tainan (TW); Chen-Hui Huang, Hsinchu (TW); Cheng-Hsien Chen, Yunlin County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 388 days.

(21) Appl. No.: 16/429,772

(22) Filed: Jun. 3, 2019

(65) Prior Publication Data
US 2020/0380693 A1 Dec. 3, 2020

(51) Int. Cl.
*G06T 7/13* (2017.01)
*G06T 7/00* (2017.01)
*G06T 7/60* (2017.01)

(52) U.S. Cl.
CPC .............. *G06T 7/13* (2017.01); *G06T 7/0004* (2013.01); *G06T 7/60* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 5,150,422 A | * | 9/1992 | Kitakado | G06T 7/0006 348/126 |
| 5,214,712 A | * | 5/1993 | Yamamoto | G06T 7/0004 348/126 |
| 5,923,430 A | * | 7/1999 | Worster | G01N 21/95607 356/394 |
| 7,149,340 B2 | | 12/2006 | Filseth et al. | |
| 7,171,047 B2 | | 1/2007 | Grinchuk et al. | |
| 8,401,273 B2 | | 3/2013 | Momonoi et al. | |

(Continued)

OTHER PUBLICATIONS

Search report issued by EPO dated Oct. 5, 2020.

*Primary Examiner* — Samah A Beg
(74) *Attorney, Agent, or Firm* — WPAT, PC

(57) ABSTRACT

An automatic detecting method and an automatic detecting apparatus using the same are provided. The automatic detecting apparatus includes an inputting unit, a dividing unit, a contouring unit, a range analyzing unit, a boundary analyzing unit, an edge detecting unit, an expanding unit and an overlapping unit. The dividing unit is used for dividing an overlooking image into four clusters via a clustering algorithm. The contouring unit is used for obtaining a contour. The range analyzing unit is used for obtaining a detecting range. The boundary analyzing unit is used for obtaining a circular boundary in the detecting range. The edge detecting unit is used for obtaining a plurality of edges in the circular boundary. The expanding unit is used for expanding the edges to obtain a plurality of expanded edges. The overlapping unit is used for overlapping the expanded edges and the contour to obtain a defect pattern.

20 Claims, 6 Drawing Sheets

(56) References Cited

U.S. PATENT DOCUMENTS

| | | | |
|---|---|---|---|
| 2007/0104357 A1* | 5/2007 | Worster | G01N 21/94 382/149 |
| 2007/0280501 A1* | 12/2007 | Walton | G06T 7/0004 382/100 |
| 2016/0292845 A1 | 10/2016 | Cheng | |
| 2018/0088060 A1* | 3/2018 | Shim | H01L 22/34 |
| 2019/0164265 A1* | 5/2019 | Liao | G06T 5/006 |

* cited by examiner

AUTOMATIC DETECTING METHOD AND AUTOMATIC DETECTING APPARATUS USING THE SAME

TECHNICAL FIELD

The disclosure relates in general to a detecting method and a detecting apparatus using the same, and more particularly to an automatic detecting method and an automatic detecting apparatus using the same.

BACKGROUND

Along with the development of semiconductor, several novel semiconductor devices are invented. In the semiconductor devices, metal lines located at different layer may be electrically connected through a via hole filled with a conductive material.

The via hole may be formed by etching an insulation layer. However, if a residue is remained in an etched via hole, the conductivity may be greatly reduced. Therefore, the researchers try to develop an automatic detecting apparatus for detecting the etched via hole.

SUMMARY

The disclosure is directed to an automatic detecting method and an automatic detecting apparatus using the same. By performing several image processing steps, residues in an etched via hole can be automatically detected without any human power. Therefore, 100% inspection for a plurality of etched via holes is possible.

According to one embodiment, an automatic detecting apparatus for detecting an etched via hole is provided. The automatic detecting apparatus includes an inputting unit, a dividing unit, a contouring unit, a range analyzing unit, a boundary analyzing unit, an edge detecting unit, an expanding unit and an overlapping unit. The inputting unit is used for inputting an overlooking image of the etched via hole. The dividing unit is used for dividing the overlooking image into a first cluster, a second cluster, a third cluster and a fourth cluster via a clustering algorithm. The contouring unit is used for obtaining a contour according to the first cluster. A first average pixel value of the first cluster is larger than a second average pixel value of the second cluster, a third average pixel value of the third cluster and a fourth average pixel value of the fourth cluster. The range analyzing unit is used for obtaining a detecting range according to the fourth cluster. The fourth average pixel value of the fourth cluster is less than the first average pixel value of the first cluster, the second average pixel value of the second cluster and the third average pixel value of the third cluster. The boundary analyzing unit is used for obtaining a circular boundary in the detecting range. The edge detecting unit is used for obtaining a plurality of edges in the circular boundary. The expanding unit is used for expanding the edges to obtain a plurality of expanded edges. The overlapping unit is used for overlapping the expanded edges and the contour to obtain a defect pattern.

According to another embodiment, an automatic detecting method for detecting an etched via hole is provided. An overlooking image of the etched via hole is inputted. The overlooking image is divided into a first cluster, a second cluster, a third cluster and a fourth cluster in the overlooking image via a clustering algorithm. A contour is obtained according to the first cluster. A first average pixel value of the first cluster is larger than a second average pixel value of the second cluster, a third average pixel value of the third cluster and a fourth average pixel value of the fourth cluster. A detecting range is obtained according to the fourth cluster. The fourth average pixel value of the fourth cluster is less than the first average pixel value of the first cluster, the second average pixel value of the second cluster and the third average pixel value of the third cluster. At least one circular boundary is obtained in the detecting range. A plurality of edges inside the circular boundary are obtained. The edges are expanded to obtain a plurality of expanded edges. The expanded edges and the contour are overlapped to obtain a defect pattern.

Figure 1:
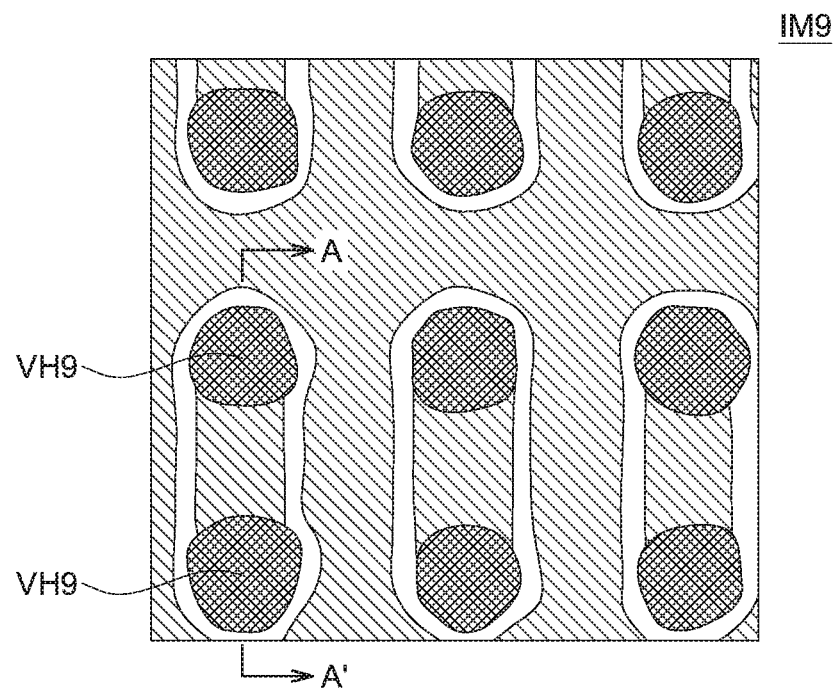
FIG. 1 shows an overlooking image of a plurality of etched via holes.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
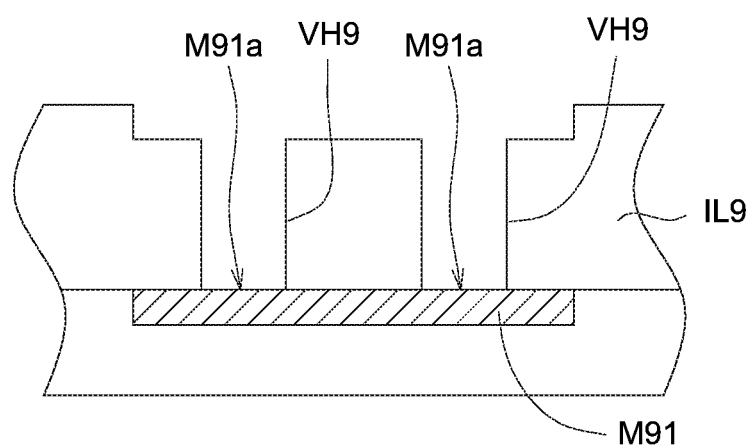
FIG. 2 shows a cross-section view of the etched via holes along a section line A-A'.
Figure 3:
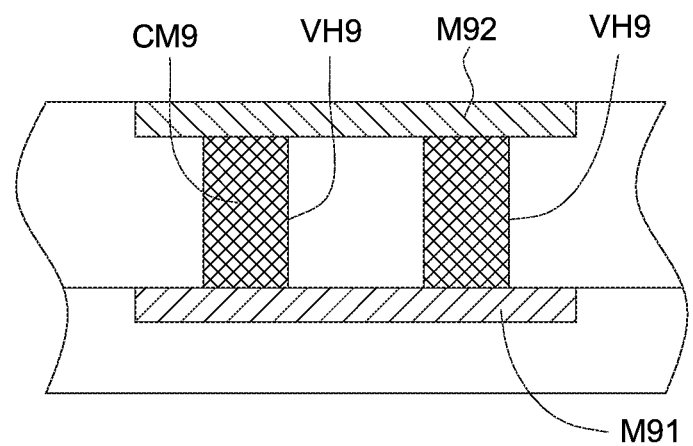
FIG. 3 shows another metal line.

Please refer to FIG. 1, which shows an overlooking image IM9 of a plurality of etched via holes VH9. In one embodiment, the overlooking image IM9 is a Scanning Electron Microscope (SEM) image. In FIG. 1, the etched via holes VH9 are well etched without any residue. Please refer to FIG. 2, which shows a cross-section view of the etched via holes VH9 along a section line A-A'. An insulation layer IL9 is etched, by wet-etching or dry-etching, to form the etched via holes VH9. The etched via holes VH9 exposure a top surface M91a of a metal line M91. Please refer to FIG. 3, which shows another metal line M92. The etched via holes VH9 are filled with a conductive material CM9 and the metal line M92 is formed on the conductive material CM9, such that the metal line M91 and the metal line M92 are electrically connected with each other through the conductive material CM9 filled in the etched via holes VH9.

Figure 4:
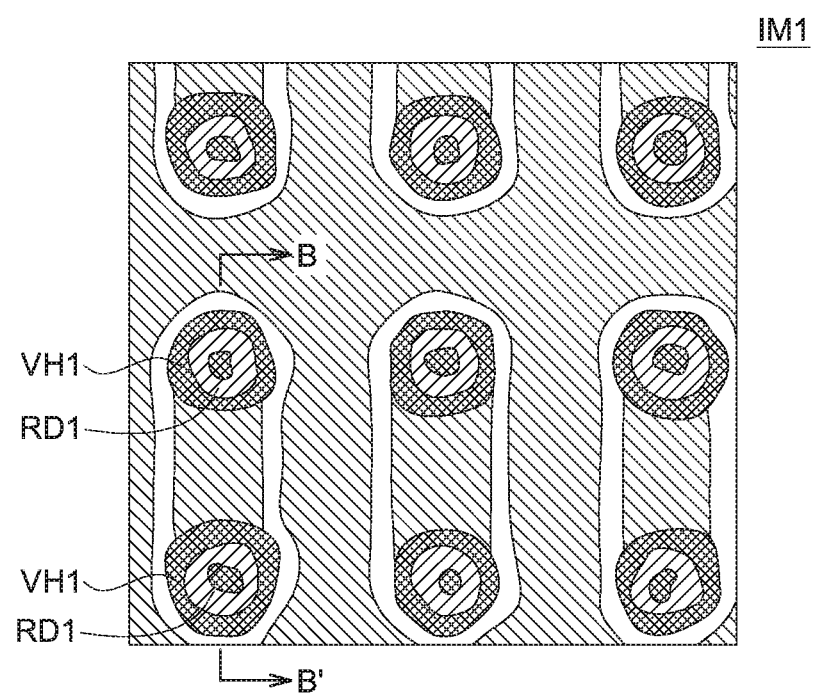
FIG. 4 shows an overlooking image of a plurality of etched via holes.

Please refer to FIG. 4, which shows an overlooking image IM1 of a plurality of etched via holes VH1. In one embodiment, the overlooking image IM9 is a Scanning Electron Microscope (SEM) image. In FIG. 4, the etched via holes VH1 are not well etched and some residues RD1 are remained. Please refer to FIG. 5, which shows a cross-section view of the etched via holes VH1 along a section line B-B'. An insulation layer IL1 is etched, by wet-etching or dry-etching, to form the etched via holes VH1. The etched via holes VH1 exposure a top surface M1a of a metal line M1. Please refer to FIG. 6, which shows another metal line M2. The etched via holes VH1 are filled with a conductive material CM1 and the metal line M2 is formed on the conductive material CM1, such that the metal line M1 and the metal line M2 are electrically connected with each other through the conductive material CM1 filled in the etched via holes VH1. As shown in FIG. 6, the residues RD1 are remained on the top surface M1a, so the conductivity between the metal line M1 and the metal line M2 is reduced.

Figure 7:
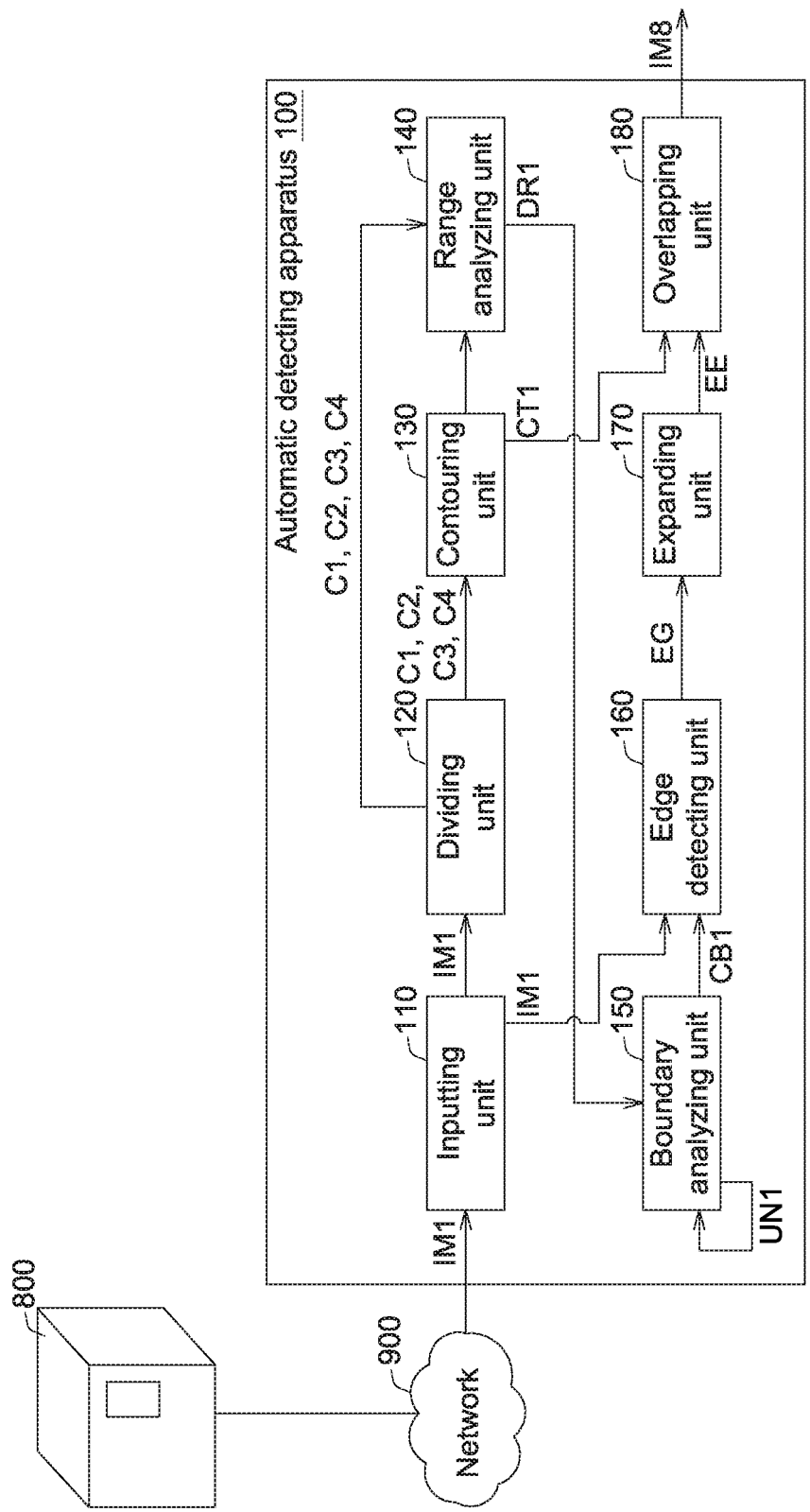
FIG. 7 shows an automatic detecting apparatus for detecting the etched via hole(s).

Please refer to FIG. 7, which shows an automatic detecting apparatus 100 for detecting the etched via hole(s) VH1. The automatic detecting apparatus 100 helps the operators to automatically detect the residues RD1 in the etched via hole(s) VH1 without any human power.

The automatic detecting apparatus 100 includes an inputting unit 110, a dividing unit 120, a contouring unit 130, a range analyzing unit 140, a boundary analyzing unit 150, an edge detecting unit 160, an expanding unit 170 and an overlapping unit 180. The inputting unit 110 is used to input data. For example, the inputting unit 110 may be a wireless transmission module, a connecting line, or a card reader. The dividing unit 120, the contouring unit 130, the range analyzing unit 140, the boundary analyzing unit 150, the edge detecting unit 160, the expanding unit 170 and the overlapping unit 180 are used to perform several image processing steps. Each of the dividing unit 120, the contouring unit 130, the range analyzing unit 140, the boundary analyzing unit 150, the edge detecting unit 160, the expanding unit 170 and the overlapping unit 180 may be a circuit, a chip, a circuit board or a storage device storing a plurality of program codes. The operation of those elements is illustrated via a flowchart.

Figure 8:
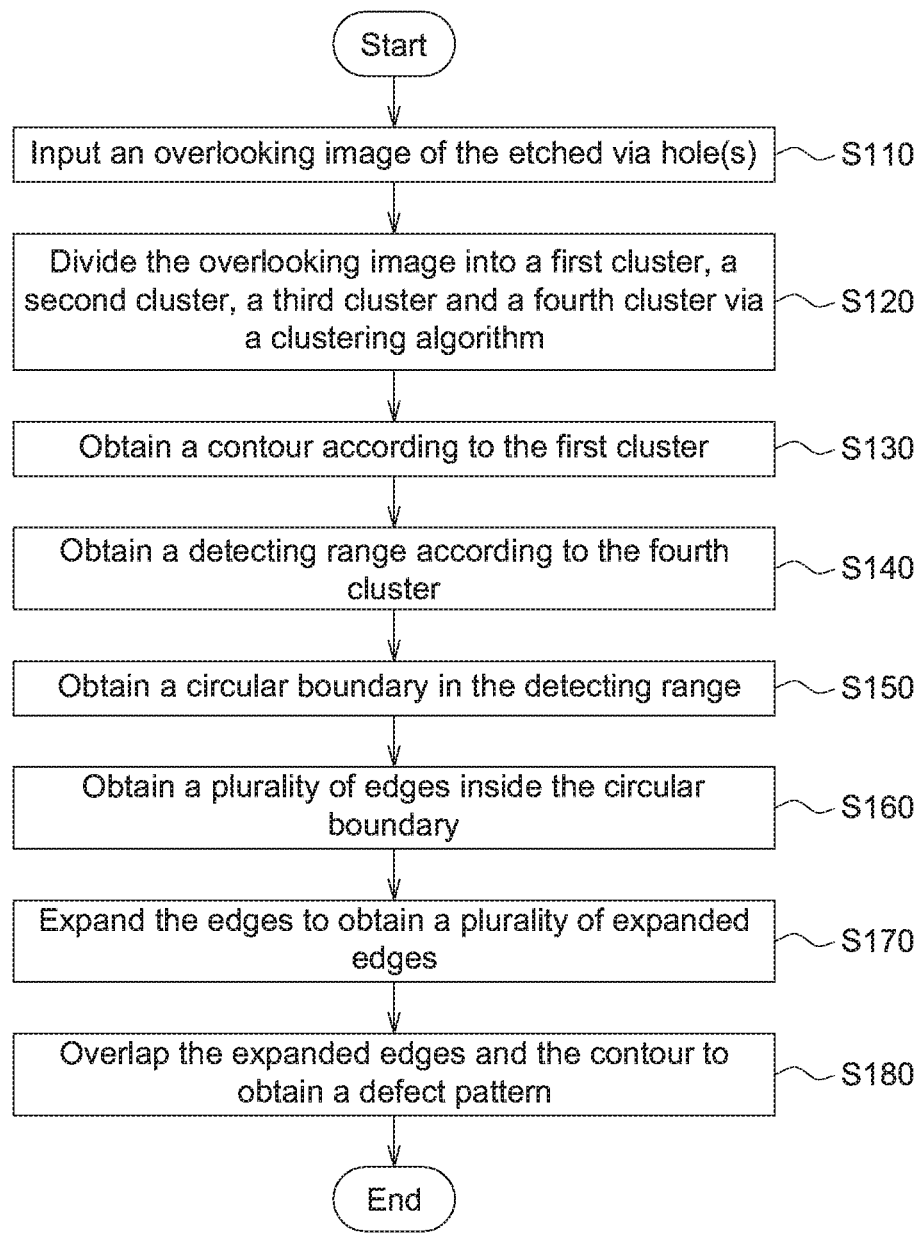
FIG. 8 shows a flowchart of an automatic detecting method for detecting the etched via hole(s) according to one embodiment.
Figure 9:
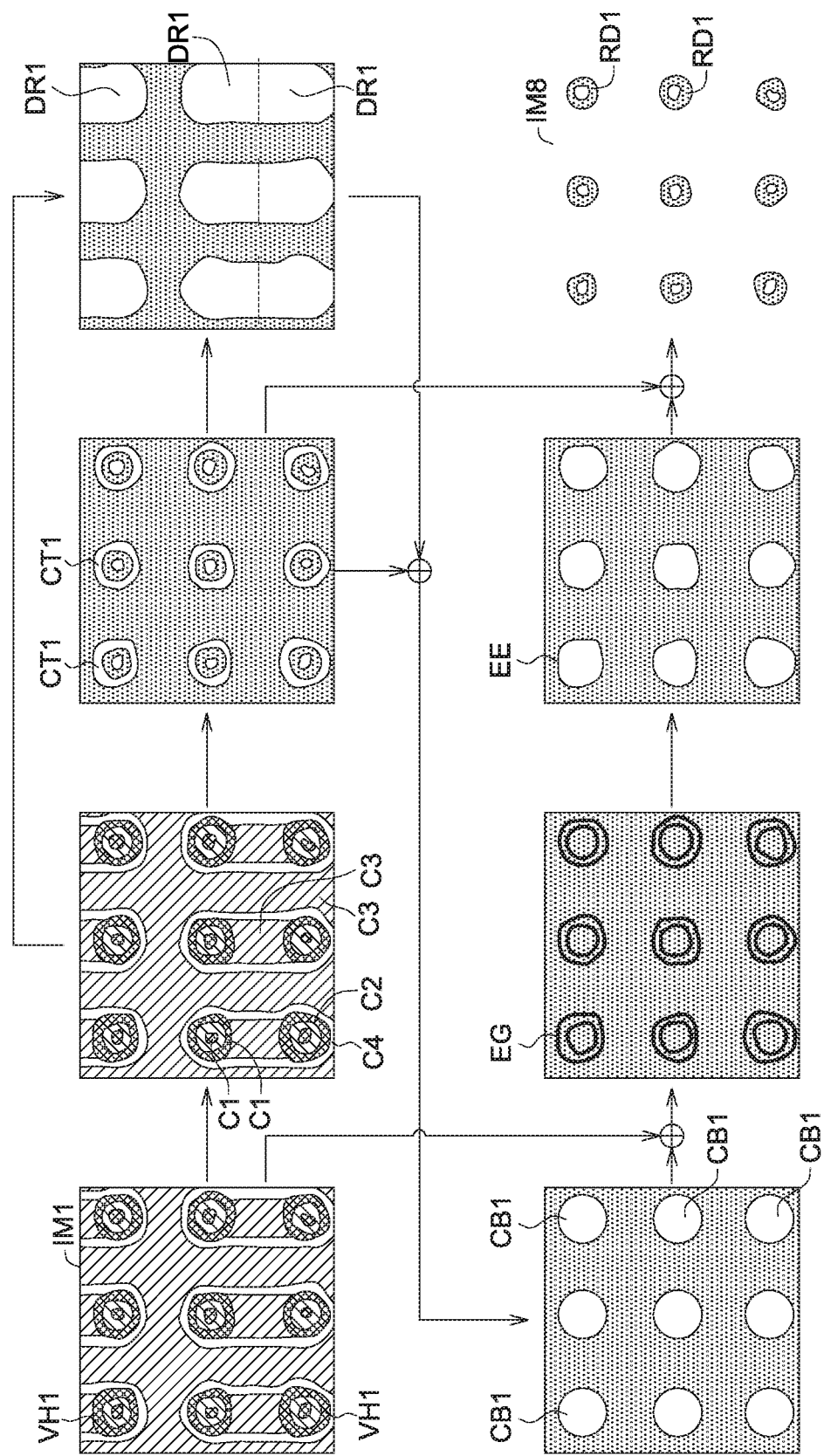
FIG. 9 illustrates each of the steps in FIG. 8.

Please refer to FIGS. 7 to 9. FIG. 8 shows a flowchart of an automatic detecting method for detecting the etched via hole(s) VH1 according to one embodiment. FIG. 9 illustrates each of the steps in FIG. 8. In step S110, the inputting unit 110 inputs (or receives) the overlooking image IM1 of the etched via hole(s) VH1. In one embodiment, the overlooking image IM1 is a monochrome grayscale image. The overlooking image IM1 may be transmitted from a processing machine 800 through the network 900.

Then, in step S120, the dividing unit 120 divides the overlooking image IM1 into a first cluster C1, a second cluster C2, a third cluster C3 and a fourth cluster C4 in the overlooking image IM1 via a clustering algorithm. In one embodiment, the clustering algorithm is a K-means algorithm. The overlooking image IM1 is divided according to a plurality of grayscale values.

Figure 5:
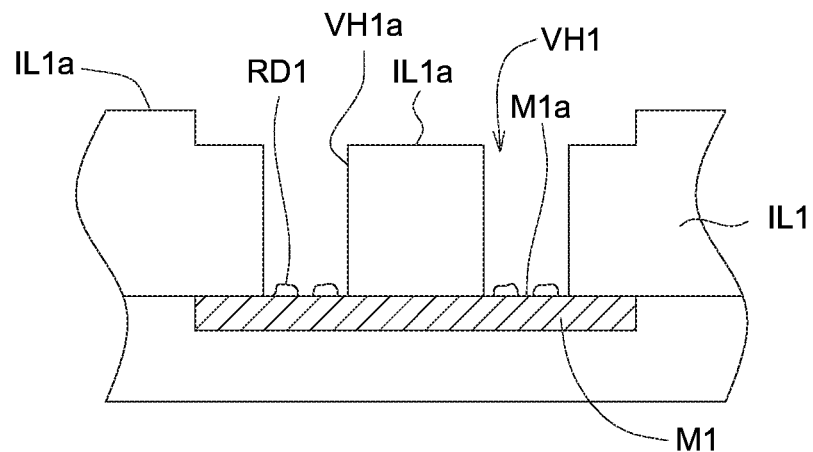
FIG. 5 shows a cross-section view of the etched via holes along a section line B-B'.
Figure 6:
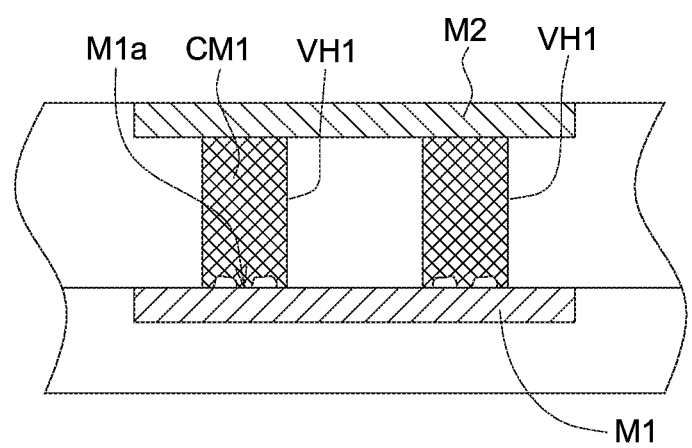
FIG. 6 shows another metal line.

Referring to both of FIG. 5 and FIG. 9, the first cluster C1 represents the top surface M1a of the metal line M1, the second cluster C2 represents the residues RD1, the third cluster C3 represents the top surface IL1a of the insulation layer IL1, and the fourth cluster C4 represents the sidewall VH1a of the etched via hole(s) VH1. As shown in FIG. 9, the first cluster C1 is the darkest among the first cluster C1, the second cluster C2, the third cluster C3 and the fourth cluster C4. The fourth cluster C4 is the whitest among the first cluster C1, the second cluster C2, the third cluster C3 and the fourth cluster C4.

Afterwards, in step S130, the contouring unit 130 obtains a contour CT1 according to the first cluster C1. A first average pixel value of the first cluster C1 is larger than a second average pixel value of the second cluster C2, a third average pixel value of the third cluster C3 and a fourth average pixel value of the fourth cluster C4. In one embodiment, the contouring unit 130 performs a binarization process based on the first cluster C1 to obtain the contour CT1. For example, the pixel values of the pixels in the first cluster C1 are changed to be "1" and the pixel values of the pixels in the second cluster C2, the third cluster C3 and the fourth cluster C4 are changed to be "0." The first cluster C1 represents the top surface M1a of the metal line M1, so the contour CT1 obtained according to the first cluster C1 is probably the contour of the residues RD1.

Next, in step S140, the range analyzing unit 140 obtains a detecting range DR1 according to the fourth cluster C4. The fourth average pixel value of the fourth cluster C4 is less than the first average pixel value of the first cluster C1, the second average pixel value of the second cluster C2 and the third average pixel value of the third cluster C3. In one embodiment, the range analyzing unit 140 performs a binarization process based on the fourth cluster C4 to obtain the detecting range DR1. For example, the internal in fourth cluster C4 is changed to be "1" and others are changed to be "0."

Further, as shown in FIG. 9, in case of that one fourth cluster C4 corresponds two contours CT1, two detecting ranges DR1 will be obtained in this fourth cluster C4.

Then, in step S150, the boundary analyzing unit 150 obtains a circular boundary CB1 in the detecting range DR1. In one embodiment, the boundary analyzing unit 150 overlaps the detecting range DR1 and the contour CT1 to obtain a union pattern UN1. Then, the boundary analyzing unit 150 calculates an X coordinate and a radius of a center of the circular boundary CB1 according to the leftmost point and the rightmost point of the union pattern UN1. Afterwards, the boundary analyzing unit 150 calculates a Y coordinate of the center of the circular boundary CB1 according to the radius and the top point and the bottom point of the union pattern UN1. In another embodiment, the circular boundary CB1 maybe an inscribed circle of the detecting range DR1.

The circular boundary CB1 is used to define a limited area where the residues RD1 may be located. For example, the detecting range DR1 represents the sidewall VH1a (shown in FIG. 5) of the etched via hole(s) VH1, so the circular boundary CB1 is limited within the sidewall VH1a of the etched via hole(s) VH1.

Afterwards, in step S160, the edge detecting unit 160 obtains a plurality of edges EG inside the circular boundary CB1. Those edges EG probably are formed by the rough surfaces of the residues RD1.

Next, in step S170, the expanding unit 170 expands the edges EG to obtain a plurality of expanded edges EE. In the image processing process, a n*n kernel matrix can be used to increase the width of n/2 pixels. For example, a 15*15 kernel matrix can be used to increase the width of 7 pixels. In another embodiment, the expanding unit 170 magnifies the edges EG by 2 to 4 times. Because the edges EG probably are formed by the rough surfaces of the residues RD1, the expanded edges EE are probably the residues RD1.

Then, in step S180, the overlapping unit 180 overlaps the expanded edges EE and the contour CT1 to obtain a defect pattern IM8 containing the residues RD1. Because the expanded edges EE are probably the residues RD1, so the residues RD1 can be obtained by overlapping the expanded edges EE and the contour CT1.

According to the embodiments described above, by performing several image processing steps, the automatic detecting method and the automatic detecting apparatus 100 help the operators to automatically detect the residues RD1 in the etched via hole(s) VH1 without any human power. Therefore, 100% inspection for a lot of etched via holes is possible.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An automatic detecting apparatus for detecting an etched via hole, comprising:
   an inputting unit for inputting an overlooking image of the etched via hole;
   a dividing unit for dividing the overlooking image into a first cluster, a second cluster, a third cluster and a fourth cluster via a clustering algorithm;
   a contouring unit for obtaining a contour according to the first cluster, wherein a first average pixel value of the first cluster is larger than a second average pixel value of the second cluster, a third average pixel value of the third cluster and a fourth average pixel value of the fourth cluster;
   a range analyzing unit for obtaining a detecting range according to the fourth cluster, wherein the fourth average pixel value of the fourth cluster is less than the first average pixel value of the first cluster, the second average pixel value of the second cluster and the third average pixel value of the third cluster;
   a boundary analyzing unit for obtaining a circular boundary in the detecting range;
   an edge detecting unit for obtaining a plurality of edges inside the circular boundary;
   an expanding unit for expanding the plurality of edges to obtain a plurality of expanded edges; and
   an overlapping unit for overlapping the plurality of expanded edges and the contour to obtain a defect pattern.

2. The automatic detecting apparatus according to claim 1, wherein the overlooking image is a monochrome grayscale image.

3. The automatic detecting apparatus according to claim 1, wherein the clustering algorithm is a K-means algorithm.

4. The automatic detecting apparatus according to claim 1, wherein the dividing unit divides the overlooking image according to a plurality of grayscale values.

5. The automatic detecting apparatus according to claim 1, wherein the contouring unit performs a binarization process based on the first cluster to obtain the contour.

6. The automatic detecting apparatus according to claim 1, wherein the range analyzing unit performs a binarization process based on the fourth cluster to obtain the detecting range.

7. The automatic detecting apparatus according to claim 1, wherein the boundary analyzing unit overlaps the detecting range and the contour to obtain an union pattern, and the boundary analyzing unit obtains the circular boundary according to a leftmost point, a rightmost point, a top point and a bottom point of the union pattern.

8. The automatic detecting apparatus according to claim 7, wherein the boundary analyzing unit calculates an X coordinate and a radius of a center of the circular boundary according to the leftmost point and the rightmost point of the union pattern, then the boundary analyzing unit calculates a Y coordinate of the center of the circular boundary according to the radius and the top point and the bottom point of the union pattern.

9. The automatic detecting apparatus according to claim 1, wherein the circular boundary is an inscribed circle of the detecting range.

10. The automatic detecting apparatus according to claim 1, wherein the edge expanding unit expands the edges via a kernel matrix.

11. An automatic detecting method for detecting an etched via hole, comprising:
    inputting an overlooking image of the etched via hole;
    dividing the overlooking image into a first cluster, a second cluster, a third cluster and a fourth cluster in the overlooking image via a clustering algorithm;
    obtaining a contour according to the first cluster, wherein a first average pixel value of the first cluster is larger than a second average pixel value of the second cluster, a third average pixel value of the third cluster and a fourth average pixel value of the fourth cluster;
    obtaining a detecting range according to the fourth cluster, wherein the fourth average pixel value of the fourth cluster is less than the first average pixel value of the first cluster, the second average pixel value of the second duster and the third average pixel value of the third duster; obtaining a circular boundary in the detecting range;
    obtaining a plurality of edges inside the circular boundary;
    expanding the plurality of edges to obtain a plurality of expanded edges; and
    overlapping the plurality of expanded edges and the contour to obtain a defect pattern.

12. The automatic detecting method according to claim 11, wherein in the step of inputting the overlooking image, the overlooking image is a monochrome grayscale image.

13. The automatic detecting method according to claim 11, wherein in the step of dividing the overlooking image, the clustering algorithm is a K-means algorithm.

14. The automatic detecting method according to claim 11, wherein in the step of dividing the overlooking image, the overlooking image is divided according to a plurality of grayscale values.

15. The automatic detecting method according to claim 11, wherein in the step of obtaining the contour, a binarization process is performed based on the first cluster.

16. The automatic detecting method according to claim 11, wherein in the step of obtaining the detecting range, a binarization process is performed based on the fourth cluster.

17. The automatic detecting method according to claim 11, wherein in the step of obtaining the circular boundary, the detecting range and the contour are overlapped to obtain an union pattern, and the circular boundary is obtained according to a leftmost point, a rightmost point, a top point and a bottom point of the union pattern.

18. The automatic detecting method according to claim 17, wherein an X coordinate and a radius of a center of the circular boundary are calculated according to the leftmost point and the rightmost point of the union pattern, a Y coordinate of the center of the circular boundary is calculated according to the radius and the top point and the bottom point of the union pattern.

19. The automatic detecting method according to claim 11, wherein in the step of obtaining the circular boundary, the circular boundary is an inscribed circle of the detecting range.

20. The automatic detecting method according to claim 11, wherein in the step of expanding the edges, the edges are expanded via a kernel matrix.

* * * * *